(12) United States Patent
Lee (10) Patent No.: US 7,830,159 B1
(45) Date of Patent: Nov. 9, 2010

(54) CAPACITOR MISMATCH MEASUREMENT METHOD FOR SWITCHED CAPACITOR CIRCUITS

(75) Inventor: Bumha Lee, Pleasanton, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 211 days.

(21) Appl. No.: 12/249,475

(22) Filed: Oct. 10, 2008

(51) Int. Cl.
*G01R 27/26* (2006.01)

(52) U.S. Cl. .................. 324/679; 324/678; 341/120

(58) Field of Classification Search .............. 324/601, 324/658, 678, 679
See application file for complete search history.

(56) References Cited

U.S. PATENT DOCUMENTS

| | | | |
|---|---|---|---|
| 6,617,992 | B2 | 9/2003 | Sakurai |
| 6,891,486 | B1 * | 5/2005 | Pentakota et al. ........... 341/120 |
| 6,956,519 | B1 | 10/2005 | Huang et al. |
| 6,963,300 | B1 | 11/2005 | Lee |
| 7,187,318 | B1 | 3/2007 | Lee et al. |

* cited by examiner

*Primary Examiner*—Vincent Q Nguyen
(74) *Attorney, Agent, or Firm*—Patent Law Group LLP; Carmen C. Cook (57) ABSTRACT

A method for calibrating a capacitor mismatch error between a sampling capacitor and a feedback capacitor in a switched capacitor circuit includes sampling a fixed input voltage onto the sampling capacitor during a sampling phase of the switched capacitor circuit; placing the switched capacitor circuit in a hold/amplification phase of the switched capacitor circuit; providing a pair of level shift voltages alternately to the first plate of the sampling capacitor; generating a pair of output voltages at an output terminal of an amplifier where the pair of output voltages are a function of the sampled fixed input voltage, amplified by the amplifier and level shifted by the pair of level shift voltages and the pair of output voltages resemble output voltages in normal operation of the switched capacitor circuit; and comparing the pair of output voltages with respective corresponding ideal output voltages values to determine the capacitor mismatch error.

14 Claims, 7 Drawing Sheets

CAPACITOR MISMATCH MEASUREMENT METHOD FOR SWITCHED CAPACITOR CIRCUITS

FIELD OF THE INVENTION

The invention relates to switched capacitor circuits and, in particular, to a method for measuring capacitor mismatch in a switched capacitor circuit.

DESCRIPTION OF THE RELATED ART

Figure 1:
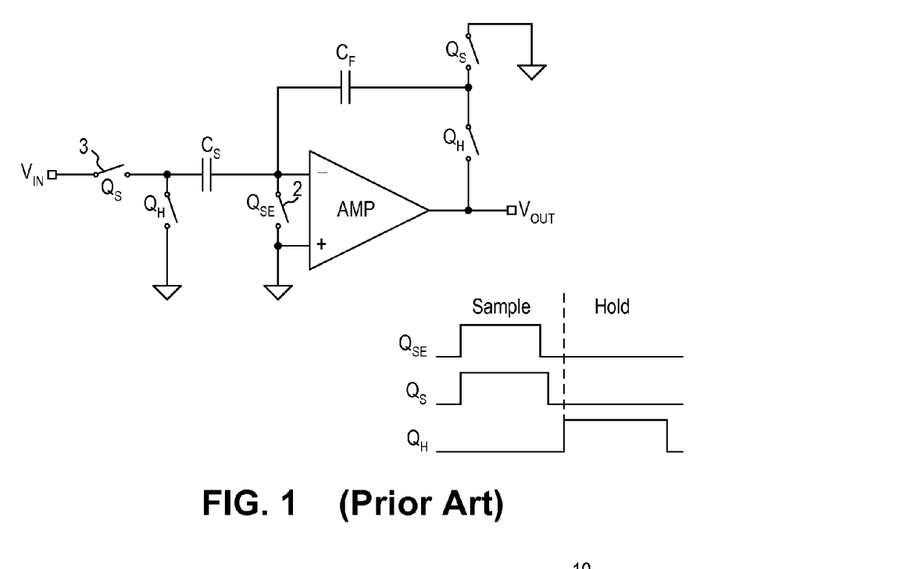
FIG. 1 is a circuit diagram of an exemplary switched capacitor circuit.

Switched capacitor circuit is commonly used as an integrated analog gain amplifier, where precise gain control is required. FIG. 1 is a circuit diagram of an exemplary switched capacitor circuit. In the present illustration, switched capacitor circuit 1 is shown configured in a single-ended fashion for simplicity. It is understood that the switched capacitor circuit can also be configured in a differential fashion receiving a differential input signal. Referring to FIG. 1, an analog input signal, $V_{IN}$, is sampled across a sampling capacitor, $C_S$, while 0V is sampled across a feedback capacitor, $C_F$, during the sampling clock period ($Q_S$ and $Q_{SE}$ active). The top plate sampling switch 2 (driven by clock $Q_{SE}$) turns off prior to the bottom plate sampling switch 3 (driven by clock $Q_S$). During the holding or amplification clock period ($Q_H$ active), the sampled charge on sampling capacitor $C_S$ is transferred onto feedback capacitor $C_F$ via the negative feedback around an amplifier AMP. Therefore, the amplifier output voltage $V_{OUT}$ becomes $V_{IN} \times C_S/C_F$.

The accuracy of the output voltage $V_{OUT}$ relies on the DC gain and the bandwidth of amplifier AMP as well as the relative capacitor matching between capacitors $C_S$ and $C_F$. There are many design techniques to compensate the output voltage error due to DC gain and bandwidth of amplifier AMP, such as using multi-stage, cascoding, or gain-boosting for the amplifier and using faster process for higher operating speed. However, there are only few ways to improve capacitor matching, such as common-centroid layout and increasing capacitor size. Capacitor matching improvement is proportional to the square root of the capacitor's size so that increasing capacitor size is not a practical approach for efficient power dissipation.

Calibration techniques have been widely used to compensate the shortcomings of the amplifier as well as capacitor mismatch issues in a switched capacitor circuit. There are mainly two different ways to implement calibration. One method is background calibration where the calibration is continuously operating to compensate error without breaking or stopping the switched capacitor circuit's normal operation. The background calibration method is most applicable when the error is the type that drifts over time, power supply and operating temperature range. The other calibration method is foreground calibration, which is performed only one time, and the calibration values are stored and then continuously applied to compensate for output error. Foreground calibration is easier and simpler to implement than background calibration. However, foreground calibration is appropriate mainly for static error such as passive component mismatch.

Electronics systems, such as communication or imaging system, often require a high-speed, high-resolution analog-to-digital converter (ADC) that can be operated at low supply voltage and with low power consumption. There are many types of ADC architecture. Pipeline ADC is popular among various types of ADC architecture due to its fast operating speed as a result of concurrently operating stages and good dynamic performance. A switched-capacitor pipeline ADC architecture is one common implementation of a high-speed, high-resolution pipeline ADC.

Figure 2:
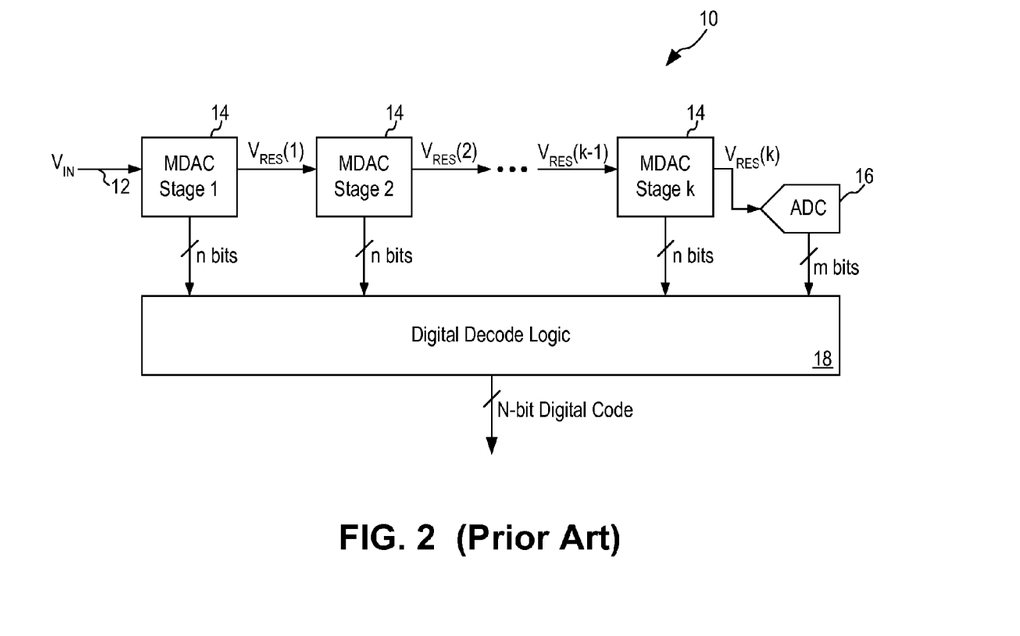
FIG. 2 is a schematic diagram of a conventional pipeline ADC.

Dynamic performance of pipeline ADC is not limited by comparator offset, but rather is limited by capacitor matching or the imperfectness of the amplifier, such as insufficient DC gain and/or bandwidth. Pipeline ADC is formed by cascade connected Multiplying Digital-to-Analog Converters (MDACs). FIG. 2 is a schematic diagram of a conventional pipeline ADC. Referring to FIG. 2, a pipeline ADC 10 includes an array of k MDAC stages 14 and a digital decode logic circuit 18. MDAC stages 14 are connected in series and each MDAC stage 14 is connected to digital decode logic circuit 18.

In operation, an analog input voltage $V_{IN}$ is sampled by the first MDAC stage (Stage 1). The first MDAC stage converts the sampled input signal to n bits of digital output. The n-bit digital output is processed by the digital decode logic 18 to generate the most significant bits (MSBs) of an N-bit digital code being a digital representation of the analog input voltage. The first MDAC stage also converts the n-bit digital output back to an analog signal. The analog signal is subtracted from the sampled analog input voltage $V_{IN}$ and multiplied by a gain multiplier to provide a residue voltage $V_{RES}$(1). The residue voltage $V_{RES}$(1) of the first MDAC stage becomes the analog input voltage to the next MDAC stage (Stage 2) of the pipeline. The conversion of the n-bit digital signals and the residue voltages continues through the pipeline with each MDAC stage generating the n-bit digital signals to be processed by the digital decode logic circuit 18. The last residue voltage $V_{RES}$(k) is converted to an m-bit digital output by an ADC 16. Digital decode logic circuit 18 generates the N-bit digital code by concatenating the n-bit digital output from the array of k MDAC stages and performing other signal processing functions.

Figure 3:
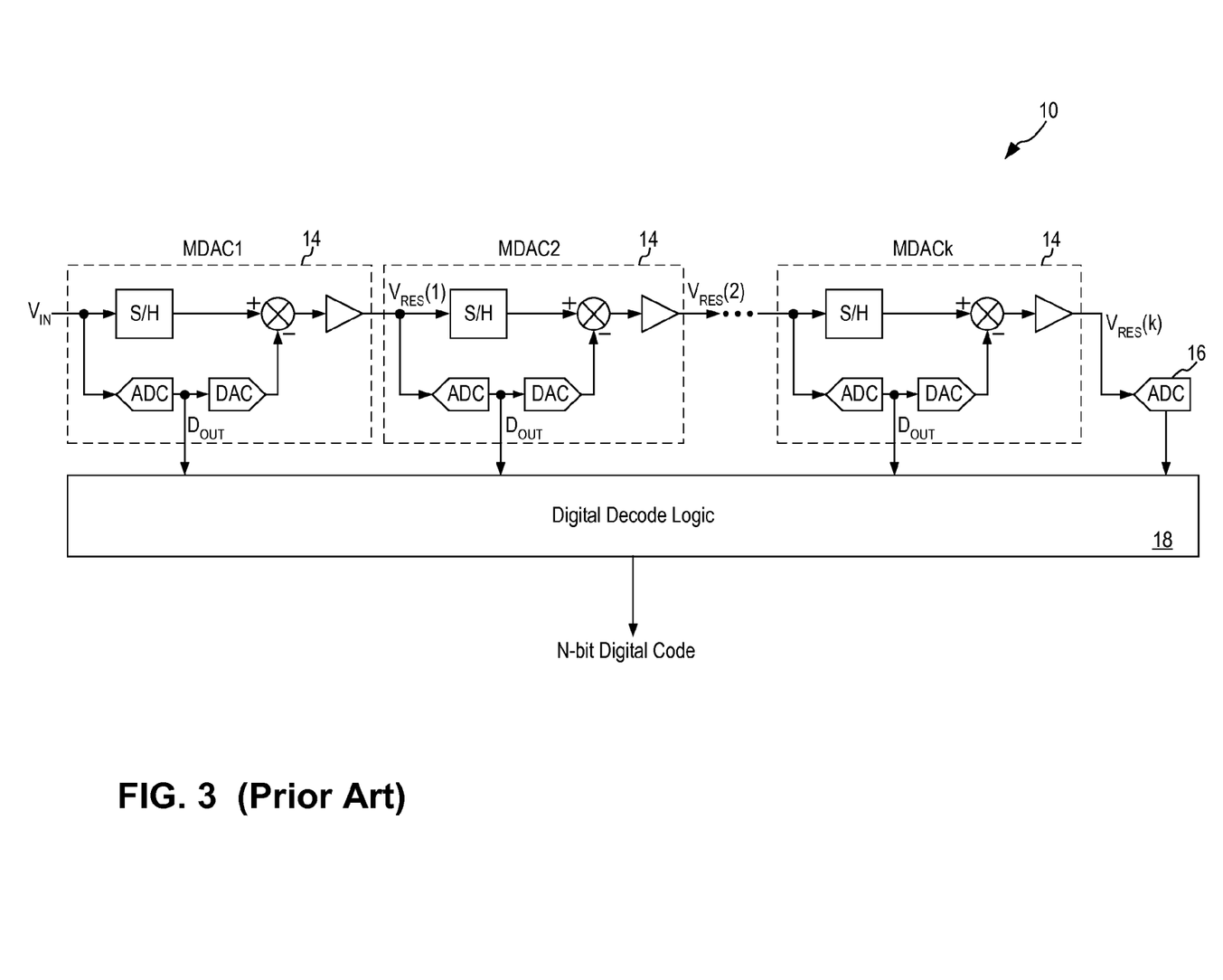
FIG. 3 is a schematic diagram of a conventional pipeline ADC illustrating the details of each MDAC stage.

FIG. 3 is a schematic diagram of a conventional pipeline ADC illustrating the details of each MDAC stage. More specifically, analog input voltage $V_{IN}$ is sampled onto a Sample-and-Hold (S/H) circuit 22 while an ADC 24 converts the input voltage $V_{IN}$ into a corresponding digital value $D_{OUT}$. Since analog-to-digital conversion must be done immediately without any latency, flash ADC is typically used as the ADC 24 in pipeline ADC 10. The digital value $D_{OUT}$ is converted back to analog form by a digital-to-analog converter (DAC) 26. The sampled analog input signal is subtracted by the output signal of DAC 26. The difference is amplified by a fixed gain amplifier to generate the residue voltage $V_{RES}$(1) as the output signal of the MDAC stage. The generation of the digital value $D_{OUT}$ and the residue voltage continues at each MDAC stage and digital decode logic circuit 18 generates the N-bit digital code indicative of the analog input voltage $V_{IN}$.

The MDAC stages in a pipeline ADC are typically implemented using a switched capacitor circuit. The linearity of the pipeline ADC is limited by the imperfectness of the amplifier as well as capacitor mismatch. While there are design techniques to increase DC gain and bandwidth of the amplifier, there are very limited solutions to improve capacitor matching. Capacitor matching therefore depends on good layout or a large unit capacitor size. Consequently, capacitor matching limits the dynamic performance of pipeline ADC.

DETAILED DESCRIPTION OF THE PREFERRED EMBODIMENTS

In accordance with the principles of the present invention, a foreground calibration method for measuring capacitor mismatch error in a switched capacitor circuit involves sampling a fixed input voltage onto the sampling capacitor during the sampling phase, which can be zero volt or any fixed DC voltage, and then, during the holding or amplification phase, selecting appropriate level shift voltages to cause the switched capacitor circuit output voltage to switch between output voltage levels that resemble normal operation. In this manner, capacitor mismatch error is measured while the switched capacitor circuit functions as if in normal operation. That is, the capacitor mismatch measurement is made under the condition that the switched capacitor circuit output voltage levels during calibration matches the output voltage level during normal operation mode. The foreground calibration method can be implemented with minimal additional circuitry and therefore does not increase the power consumption or device area of the switched capacitor circuit.

Figure 4:
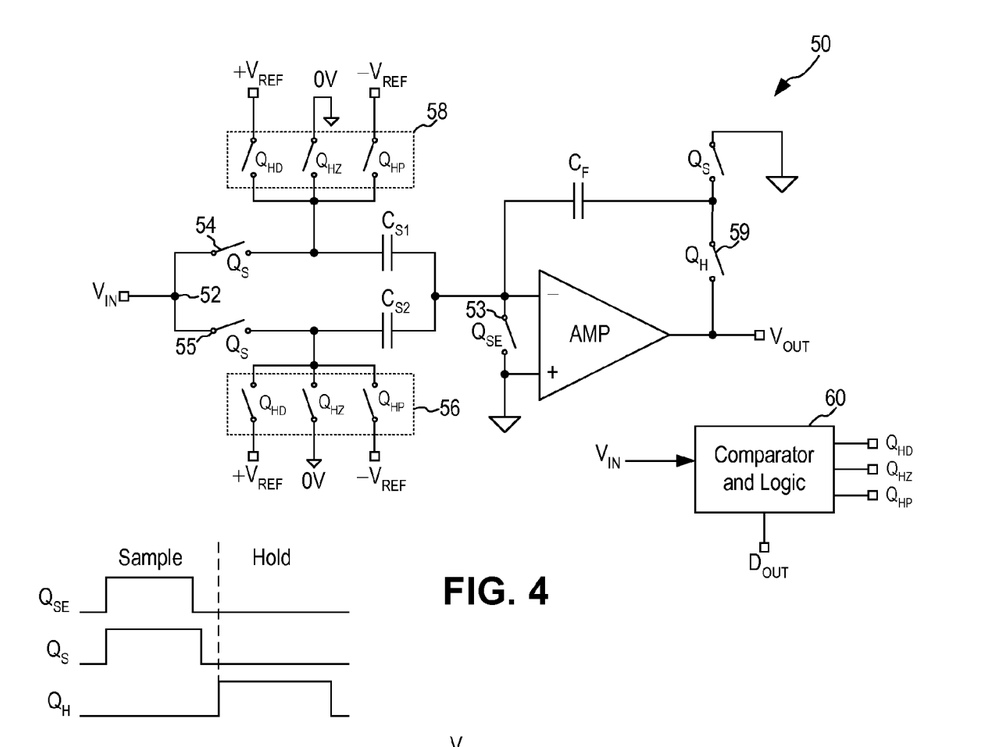
FIG. 4 is a circuit diagram of a switched capacitor circuit configured for use as a MDAC stage of a pipeline ADC according to a first embodiment of the present invention.

FIG. 4 is a circuit diagram of a switched capacitor circuit configured for use as a MDAC stage of a pipeline ADC according to a first embodiment of the present invention. The MDAC stage is a 1.5 bit per stage MDAC which means that there is only one effective bit but the MDAC stage uses at least two comparator thresholds in the ADC circuit of the MDAC stage. The extra information generated in each stage is used for redundancy. In the following description, the switched capacitor circuits are shown configured in a single-ended fashion for simplicity. It is understood that the switched capacitor circuits can also be configured in a differential fashion receiving a differential input signal.

Referring to FIG. 4, an MDAC stage of a pipeline ADC is implemented using a switched capacitor circuit 50. The MDAC stage also includes comparator and logic circuit 60 for performing the ADC function and to generate the control signals for the level shifting reference voltages. In one embodiment, the MDAC stage uses two comparators with comparator thresholds of $-\frac{1}{4}V_{REF}$ and $+\frac{1}{4}V_{REF}$ respectively. In other embodiments, four comparators with four comparator thresholds can also be used, as will be described in more detail below.

In normal operation, an analog input voltage $V_{IN}$ is provided to an input node 52 of switched capacitor circuit 50 to be sampled onto sampling capacitors $C_{S1}$ and $C_{S2}$ which are connected in parallel and each connected to the input node 52 through a bottom side sampling switch 54, 55, respectively. The analog input voltage $V_{IN}$ is sampled across sampling capacitors $C_{S1}$ and $C_{S2}$ while feedback capacitor $C_F$ is reset to 0V during the sampling clock period ($Q_S$ and $Q_{SE}$ active). Clock signal $Q_{SE}$ is deactivated first to turn off the top plate sampling switch 53 prior to clock signal $Q_S$ deactivating the bottom plate sampling switches 54, 55. During the holding or amplification clock period ($Q_H$ active), the sampled charge on sampling capacitors $C_{S1}$ and $C_{S2}$ is transferred onto feedback capacitor $C_F$ via the negative feedback around an amplifier AMP. Level shifting voltages of $+V_{REF}$, 0V, and $-V_{REF}$ are applied to the bottom plate of the sampling capacitors $C_{S1}$ and $C_{S2}$ based on the control signals $Q_{HD}$, $Q_{HZ}$ and $Q_{HP}$ generated by comparator and logic circuit 60.

Figure 5:
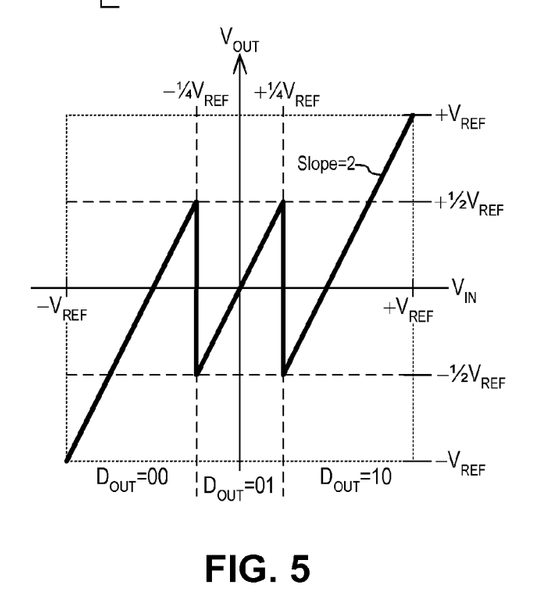
FIG. 5 illustrates the ideal transfer characteristic of the switched capacitor circuit of FIG. 4 according to one embodiment of the present invention.

In the present embodiment, the MDAC stage uses a set of two comparators to implement two comparator thresholds. FIG. 5 illustrates the ideal transfer characteristic of the switched capacitor circuit 50 when two comparator thresholds are used according to one embodiment of the present invention. In the present embodiment, the two comparator thresholds are $+\frac{1}{4}V_{REF}$ and $-\frac{1}{4}V_{REF}$. The digital output value $D_{OUT}$ has the binary code values of 00, 01 or 10 for the respective transfer function regions, as shown in FIG. 5. That is, when the input voltage $V_{IN}$ is less than $-\frac{1}{4}V_{REF}$, the digital output value $D_{OUT}$ is 00. When the input voltage $V_{IN}$ is between $-\frac{1}{4}V_{REF}$ and $+\frac{1}{4}V_{REF}$, the digital output value $D_{OUT}$ is 01. When the input voltage $V_{IN}$ is greater than $+\frac{1}{4}V_{REF}$, the digital output value $D_{OUT}$ is 10. During the holding or amplification period, the level shifting operation of the MDAC stage is dependent on the digital output value $D_{OUT}$. Capacitors $C_{S1}$ and $C_{S2}$ are connected to level shifting voltages $+V_{REF}$, 0V and $-V_{REF}$ through a bank of switches 58 and a bank of switches 56, respectively. Depending on the digital output value $D_{OUT}$ having values of 00, 01 or 10, one of the level shifting voltages is selected and coupled to the bottom plates of capacitors $C_{S1}$ and $C_{S2}$. Capacitor $C_F$ is connected around amplifier AMP through a switch 59. At the end of the holding or amplification period (end of clock $Q_H$), the output voltage $V_{OUT}$ is two times (2X) that of the input voltage $V_{IN}$ and level shifted by $-V_{REF}$, 0V, or $+V_{REF}$ depending on the digital output value $D_{OUT}$.

The level shifting operation is shown in FIG. 5 as two discontinuities in the transfer characteristics. While the input voltage $V_{IN}$ is less than $-\frac{1}{4}V_{REF}$, the output voltage $V_{OUT}$ is level shifted by a reference voltage $V_{REF}$ from $-\frac{1}{2}V_{REF}$ to $+\frac{1}{2}V_{REF}$. On the other hand, while the input voltage $V_{IN}$ is larger than $+\frac{1}{4}V_{REF}$, the output voltage $V_{OUT}$ is level shifted by a reference voltage $-V_{REF}$ from $+\frac{1}{2}V_{REF}$ to $-\frac{1}{2}V_{REF}$. By the action of the level shifting operation, even though the MDAC stage has a 2X gain, the output voltage range of the MDAC stage remains the same as the input voltage range, i.e., within $\pm V_{REF}$. The $\pm V_{REF}$ level shifting at the MDAC stage is compensated in digital domain. Any voltage error due to level shifting in analog domain causes a discontinuity on the ADC transfer function and eventually results in non-linearity or lowered dynamic performance. However, small gain error of the MDAC transfer function itself does not cause any non-linearity error for current MDAC stage at all as long as the level shift stays same as $\pm V_{REF}$.

Figure 6:
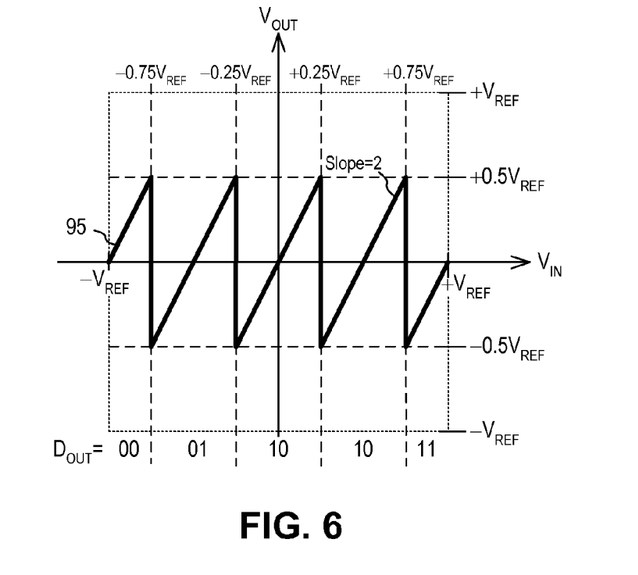
FIG. 6 illustrates the ideal transfer characteristic of the switched capacitor circuit of FIG. 4 according to an alternate embodiment of the present invention.

In FIG. 5, the transfer characteristic of the switched capacitor circuit 50 using two comparator thresholds is shown. The output voltage $V_{OUT}$ swings from $+V_{REF}$ to $-V_{REF}$. In another embodiment, four comparators with the comparator thresholds of $-\sfrac{3}{4}V_{REF}$, $-\sfrac{1}{4}V_{REF}$, $+\sfrac{1}{4}V_{REF}$ and $+\sfrac{3}{4}V_{REF}$ respectively are used to limit the output voltage $V_{OUT}$ to within $\pm\sfrac{1}{2}V_{REF}$. FIG. 6 illustrates the ideal transfer characteristic of the switched capacitor circuit of FIG. 4 according to an alternate embodiment of the present invention. In the embodiment shown in FIG. 6, the MDAC stage is provided with a second set of comparator thresholds at $\pm\sfrac{3}{4}V_{REF}$. Therefore, the output voltage $V_{OUT}$ is level shifted up by $V_{REF}$ when the input voltage reaches $-\sfrac{3}{4}V_{REF}$ and the output voltage $V_{OUT}$ is level shifted down by $V_{REF}$ when the input voltage reaches $+\sfrac{3}{4}V_{REF}$. As a result, the output voltage $V_{OUT}$ remains within $\pm\sfrac{1}{2}V_{REF}$. Accordingly, the normal operating condition of the switched capacitor circuit will depend on the exact level shift operation implemented by the ADC of the MDAC stage.

Dynamic performance of pipeline ADC relies heavily on the accuracy of DAC and the gain of the MDAC stage instead of the comparator offset. The accuracy of the DAC and the gain of the MDAC are directly dependent on matching of the capacitors in the switched capacitor circuit of the MDAC stage, assuming the amplifier has enough DC gain and wide bandwidth. There are many factors that result in capacitor mismatch. For instance, process variations in the lithography and/or etching processes during fabrication often result in capacitor mismatch. Capacitor mismatch limits linearity of pipeline ADC within 12 to 14-bit resolution when reasonable size of a unit capacitor with good layout technique is used.

The use of calibration is therefore necessary for pipeline ADC to achieve 16-bit or more resolution in terms of its linearity. In general, all known background calibration techniques for pipeline ADC compensate not only for capacitor mismatch, but also imperfectness of the amplifier, such as DC gain, DC gain drift over its output range and even incomplete settling. Nevertheless, the ADC's linearity tends to be limited by the linearity of the amplifier even after such background calibration due to the complexity of digital calibration engine.

Performance degradation due to the imperfectness of the amplifier in the switched capacitor circuit even after a background calibration is not acceptable for achieving such a high dynamic range of 16-bit or higher resolution ADC. Often it is more efficient to design an amplifier that has enough DC gain through cascading stages and/or gain-boosting and wide enough bandwidth with faster process and various design techniques. When a high performance amplifier is used in the switched capacitor circuit, capacitor mismatch is the only limiting factor and the capacitor mismatch has to be calibrated. Because capacitor mismatch is not a dynamic error, but a static one, the mismatch error can be calibrated only one time instead of needing to be continuously calibrated. Hence, foreground calibration is more suitable to address this type of static error. Foreground calibration has many advantages, including shorter calibration time, guaranteed unconditional stability, and smaller and simpler implementation in digital logic circuitry over background calibration techniques. Furthermore, most digital logic block could be turned off during normal operation after the foreground calibration is completed, minimizing actively operating logic circuit which makes noise coupling from logic block to the sensitive analog circuitry through the common substrate and/or supply and ground lines less likely. Most additional logic blocks for a background calibration operate continuously so that those logic circuitry are more prompt to be noisy.

In accordance with the principles of the present invention, a foreground calibration method to compensate for capacitor mismatch in a switched capacitor circuit of a pipeline ADC is described. The foreground calibration technique is able to measure the capacitor mismatch efficiently and furthermore is able to keep the switched capacitor circuit operation close to normal operating condition with minimally added circuitry into the MDAC. It is not desirable to introduce complex additional circuitry to the MDAC as the additional circuitry can result in lower operating speed of the MDAC due to the additional parasitic capacitance or resistance on critical analog signal path through the MDAC. In the present embodiment, the foreground calibration method measures only level shifting error and the gain error of the transfer curve is not measured.

In one embodiment, a foreground calibration method for measuring capacitor mismatch error in a switched capacitor circuit involves sampling a fixed input voltage, which can be zero volt or any fixed DC voltage, and then selecting the appropriate level shift reference voltages to cause the switched capacitor circuit output voltage to resemble normal operation. Then, the output voltage of the switched capacitor circuit is compared with the ideal output voltage to determine the amount of capacitor mismatch.

Figure 7:
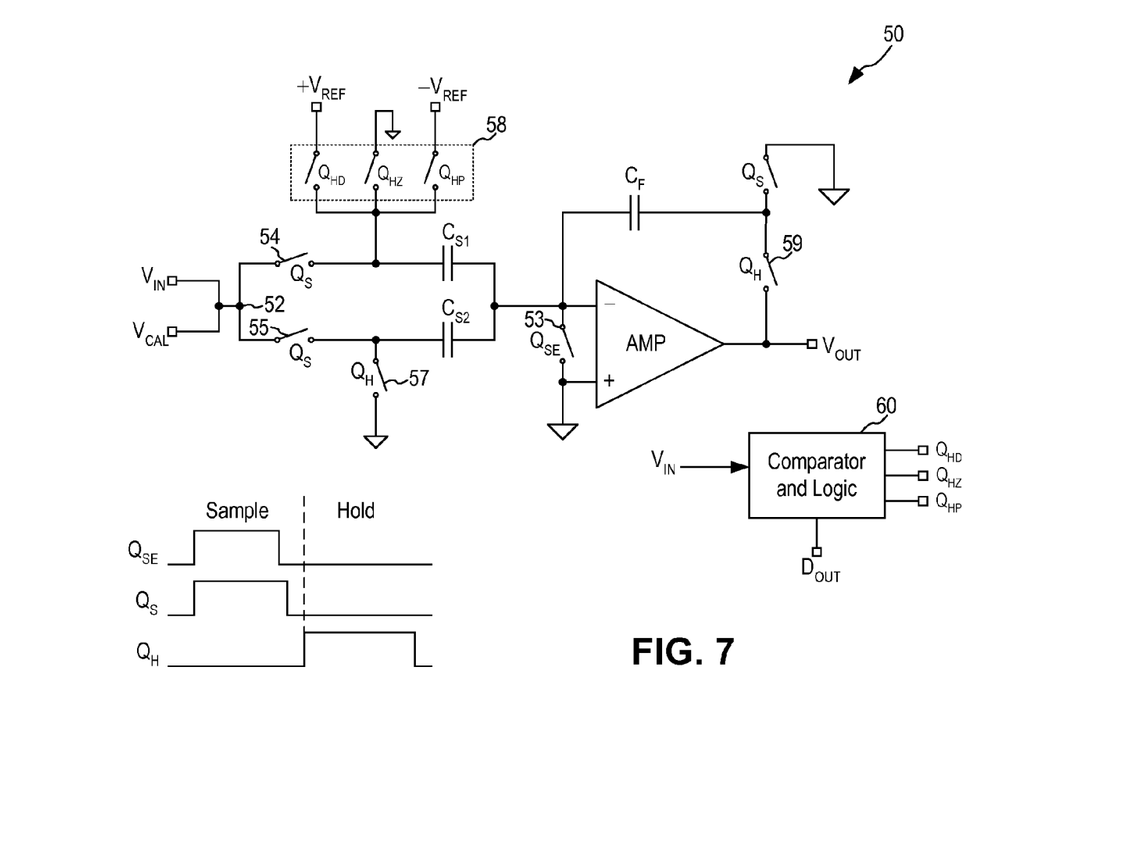
FIG. 7 is a circuit diagram of the switched capacitor circuit of FIG. 4 configured for measuring capacitor mismatch according to a first embodiment of the present invention.

FIG. 7 is a circuit diagram of the switched capacitor circuit of FIG. 4 configured for measuring capacitor mismatch according to a first embodiment of the present invention. Switched capacitor circuit 50 in FIG. 7 is configured in the same manner as switched capacitor circuit 50 in FIG. 4 except with modifications made to facilitate the foreground calibration operations for capacitor mismatch error. To facilitate the foreground calibration method of the present invention, the input node 52 is disconnected from the analog input voltage $V_{IN}$ and is connected to a fixed DC voltage $V_{CAL}$. The switchable connection between input node 52 to one of voltage $V_{IN}$ and voltage $V_{CAL}$ is not shown in FIG. 7 for simplicity but it is understood that various methods of switching two voltages onto a node can be used. Furthermore, the bottom plate of sampling capacitor $C_{S2}$ is connected through a switch 57 to the ground voltage (0V) only. The level shift voltages of $+V_{REF}$, 0V and $-V_{REF}$ are provided to the bottom plate of sampling capacitor $C_{S1}$ only.

As thus configured, the analog input voltage $V_{IN}$ is sampled across sampling capacitors $C_{S1}$ and $C_{S2}$ and feedback capacitor $C_F$ is reset to 0V during the sampling clock period ($Q_S$ and $Q_{SE}$ active). Clock signal $Q_{SE}$ is deactivated first to turn off the top plate sampling switch 53 prior to clock signal $Q_S$ deactivating the bottom plate sampling switches 54, 55. During the holding or amplification clock period ($Q_H$ active), the sampled charge on sampling capacitors $C_{S1}$ and $C_{S2}$ is transferred onto feedback capacitor $C_F$ via the negative feedback around an amplifier AMP. Assuming the capacitance of capacitors $C_{S1}$, $C_{S2}$ and $C_F$ are all identical, then the transfer function of the MDAC stage is given as:

$$V_{OUT} = \frac{C_{S1} + C_{S2}}{C_F} \times V_{IN} + \frac{C_{S1}}{C_F} \times (+V_{REF}, -V_{REF}, 0),$$

where $V_{OUT}$ is the output voltage at the amplifier AMP and $V_{REF}$ denotes the reference voltage being the voltage range of the analog input voltage and the output voltage.

In the present embodiment, the signal transfer gain is 2× with level shifting during the amplification clock phase (clock $Q_H$ active). As can be observed from the transfer function, in switched capacitor circuit 50 as thus configured, the signal transfer gain depends on the matching between capacitors $C_{S2}$, $C_{S2}$ and $C_F$, but the level shifting of the output voltage depends only on capacitor $C_{S1}$ and $C_F$. In accordance with the present embodiment, capacitor mismatch between capacitor $C_{S1}$ and $C_F$ is measured by use of selected level shifting voltages. Capacitor mismatch between capacitor $C_{S2}$ and $C_F$ is not measured as such mismatch results only in gain error which does not affect linearity and is not dealt with here.

Figure 8:
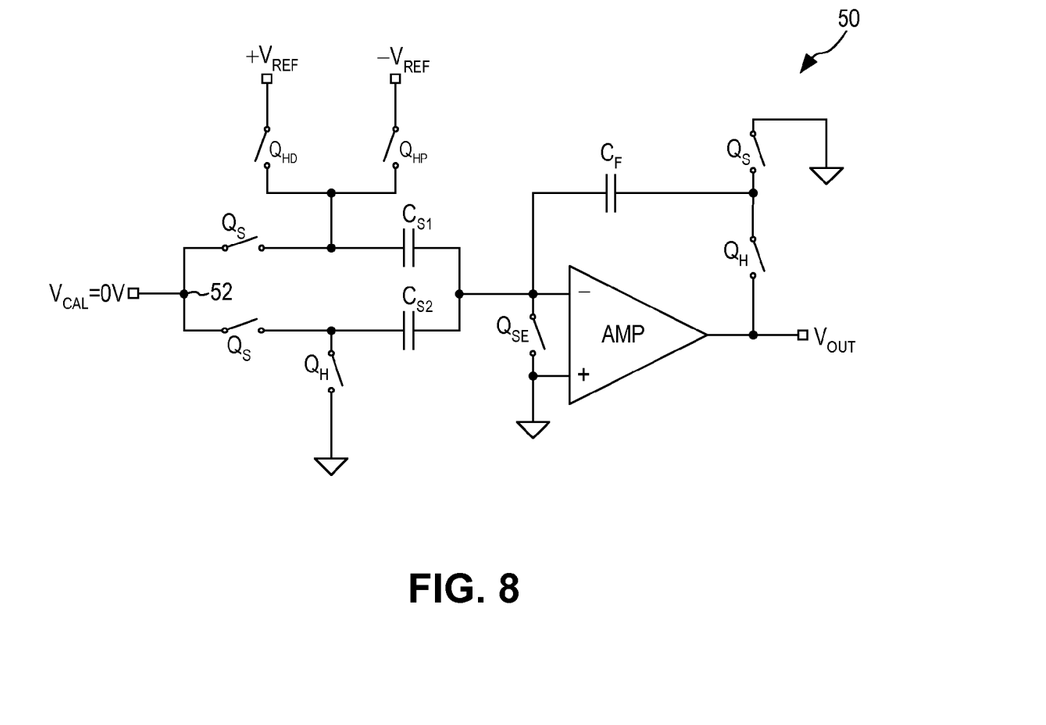
FIG. 8 illustrates a first configuration for measuring capacitor mismatch in the switched capacitor circuit of FIG. 7 according to one embodiment of the present invention.

FIG. 8 illustrates a first configuration for measuring capacitor mismatch in the switched capacitor circuit of FIG. 7 according to one embodiment of the present invention. FIG. 8 illustrates the same switched capacitor circuit of FIG. 7 but only components relevant to the calibration operation are shown. Elements that are not necessary for the calibration operation are omitted from the switched capacitor circuit 50 in FIG. 8. However, it is understood that the entire circuit of FIG. 7 is used in the normal operation of the switched capacitor implemented MDAC stage.

Referring to FIG. 8, in the present configuration, the analog input voltage $V_{IN}$ is disconnected from the input node 52. Instead, a fixed DC voltage $V_{CAL}$ of 0V is applied to the input node. During the sampling period ($Q_S$ and $Q_{SE}$ active), 0V is sampled onto all three capacitors $C_{S1}$, $C_{S2}$ and $C_F$. During the holding or amplification period ($Q_H$ active), voltages $+V_{REF}$ and $-V_{REF}$ are alternately connected to the left side of capacitor $C_{S1}$ to measure capacitor mismatch between capacitor $C_{S1}$ and capacitor $C_F$ while capacitor $C_{S2}$ is connected to 0V. More specifically, the actual output voltage $V_{OUT}$ at the two level shift voltage levels ($+V_{REF}$ and $-V_{REF}$) is compared with the ideal output voltage at the two offset voltage levels to determine the amount of mismatch error.

In the configuration shown in FIG. 8, with the input voltage at 0V and the output voltage $V_{OUT}$ being level shifted alternately between $+V_{REF}$ and $-V_{REF}$, the output voltage $V_{OUT}$ will have a total voltage level shift of $2V_{REF}$, which exceeds the normal voltage level shift of $V_{REF}$. The $2V_{REF}$ of total voltage level shift at the amplifier's output node requires the amplifier to be equipped with additional bandwidth and wider output swing. Therefore, the configuration in FIG. 8 can be used effectively to calibrate capacitor mismatch but requires the amplifier to be designed to handle the excessive output voltage swing in the basic MDAC stage.

Figure 9:
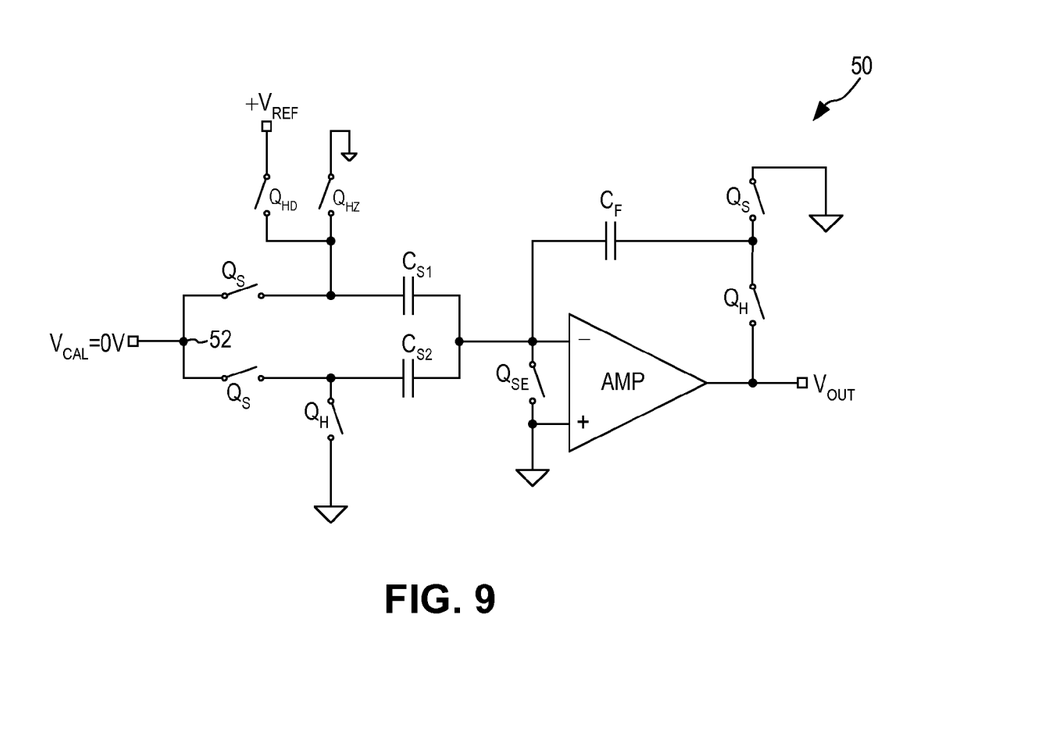
FIG. 9 illustrates a second configuration for measuring capacitor mismatch in the switched capacitor circuit of FIG. 7 according to another embodiment of the present invention.

FIG. 9 illustrates a second configuration for measuring capacitor mismatch in the switched capacitor circuit of FIG. 7 according to another embodiment of the present invention. FIG. 9 illustrates the same switched capacitor circuit of FIG. 7 but only components relevant to the calibration operation are shown. Elements that are not necessary for the calibration operation are omitted from the switched capacitor circuit 50 in FIG. 9. However, it is understood that the entire circuit of FIG. 7 is used in the normal operation of the switched capacitor implemented MDAC stage.

Referring to FIG. 9, in the present configuration, the analog input voltage $V_{IN}$ is disconnected from the input node 52. Instead, a fixed DC voltage $V_{CAL}$ of 0V is applied to the input node. During the sampling period ($Q_S$ and $Q_{SE}$ active), 0V is sampled onto all three capacitors $C_{S1}$, $C_{S2}$ and $C_F$. During the holding or amplification period ($Q_H$ active), level shift voltages $+V_{REF}$ and 0V are alternately connected to the left side of capacitor $C_{S1}$ to measure capacitor mismatch between capacitor $C_{S1}$ and capacitor $C_F$ while capacitor $C_{S2}$ is connected to 0V. Thus, the only difference between the configuration in FIG. 9 and that of FIG. 8 is that the output voltage $V_{OUT}$ is being level shifted between 0V and $-V_{REF}$ only. The actual output voltage $V_{OUT}$ at the two offset voltage levels (0V and $-V_{REF}$) is compared with the ideal output voltage at the two offset voltage levels to determine the amount of mismatch error.

In the configuration shown in FIG. 9, with the input voltage at 0V and the output voltage $V_{OUT}$ being level shifted alternately between $-V_{REF}$ and 0V, the output voltage $V_{OUT}$ will have a total voltage level shift of $V_{REF}$, which is same as the normal operation of the switched capacitor circuit. That is, when 0V is sampled onto sampling capacitors $C_{S1}$ and $C_{S2}$, level shifting to voltage $+V_{REF}$ will cause the output voltage to have a swing of $-V_{REF}$. However, in MDAC, the normal operation voltage swing is within $\pm\frac{1}{2}V_{REF}$ only. This is the case when two set of comparator thresholds are used in the MDAC stage and the transfer function of FIG. 6 is used. Thus, in the configuration shown in FIG. 9, even though the output voltage swing is within the normal operation voltage range of $V_{REF}$, the output voltage swing does not match that with the normal operation of the basic MDAC stage where the output voltage swing is within $\pm\frac{1}{2}V_{REF}$.

In an alternate embodiment, reference voltage $-V_{REF}$, instead of $+V_{REF}$, is used with the sequence of 0V for sampling onto the left side of capacitor $C_{S1}$ during the amplification phase. In that case, the output voltage $V_{OUT}$ still has absolute value of voltage $V_{REF}(=|-V_{REF}|)$ voltage swing. That is, for the configuration shown in FIG. 9, the two selected level shift voltages can be either 0V and $+V_{REF}$ or 0V and $-V_{REF}$ and a absolute $V_{REF}$ voltage swing at the output voltage will result.

Figure 10:
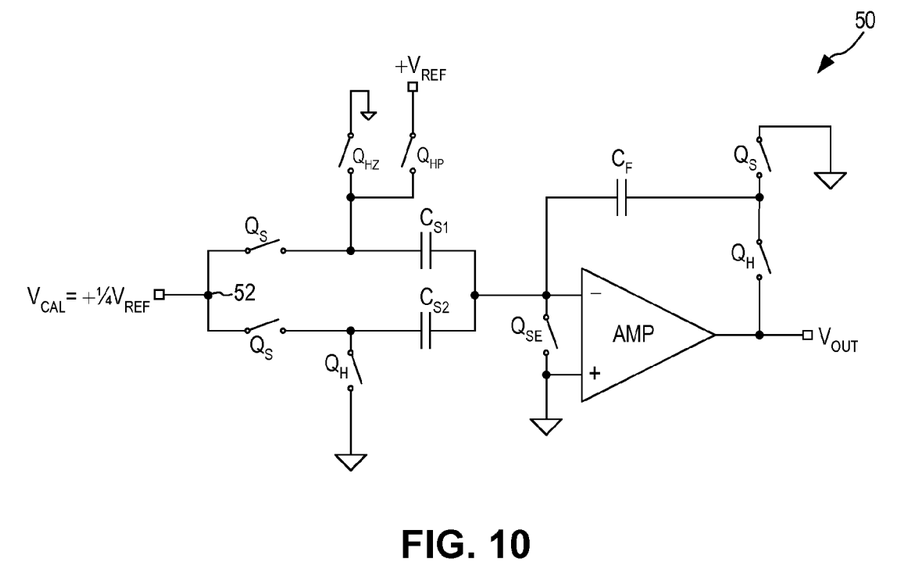
FIG. 10 illustrates a third configuration for measuring capacitor mismatch in the switched capacitor circuit of FIG. 7 according to another embodiment of the present invention.

FIG. 10 illustrates a third configuration for measuring capacitor mismatch in the switched capacitor circuit of FIG. 7 according to another embodiment of the present invention. FIG. 10 illustrates the same switched capacitor circuit of FIG. 7 but only components relevant to the calibration operation are shown. Elements that are not necessary for the calibration operation are omitted from the switched capacitor circuit 50 in FIG. 10. However, it is understood that the entire circuit of FIG. 7 is used in the normal operation of the switched capacitor implemented MDAC stage.

Referring to FIG. 10, in the present configuration, the analog input voltage $V_{IN}$ is disconnected from the input node 52. Instead, a fixed DC voltage $V_{CAL}$ of $+\frac{1}{4}V_{REF}$ is applied to the input node with voltage $+\frac{1}{4}V_{REF}$ being the ideal comparator threshold voltage (or comparator tripping point). During the sampling period ($Q_S$ and $Q_{SE}$ active), $+\frac{1}{4}V_{REF}$ is sampled onto capacitors $C_{S1}$ and $C_{S2}$ while 0V is sampled onto capacitor $C_F$. During the holding or amplification period ($Q_H$ active), output voltage $V_{OUT}$ is forced to 2 times the input voltage and is thus at $+\frac{1}{2}V_{REF}$. Meanwhile, level shifting voltages 0V and $+V_{REF}$ are alternately connected to the left side of capacitor $C_{S1}$ to measure capacitor mismatch between capacitor $C_{S1}$ and capacitor $C_F$ while capacitor $C_{S2}$ is connected to 0V. That is, the output voltage is forced to level shift between $+\frac{1}{2}V_{REF}$ and $-\frac{1}{2}V_{REF}$ and the actual output voltages are compared with the ideal output voltages to measure the error due to capacitor mismatch between capacitors $C_{S1}$ and $C_F$.

In the configuration shown in FIG. 10, the output voltage $V_{OUT}$ has a voltage swing between $+\frac{1}{2}V_{REF}$ and $-\frac{1}{2}V_{REF}$, which is same as the level shifting when the input signal is toggling at tripping points with either two or four comparators. In another embodiment, the calibration voltage $V_{CAL}$ can be $-\frac{1}{4}V_{REF}$ and the level shift voltages can be $-V_{REF}$ and 0V to yield the same $+\frac{1}{2}V_{REF}$ and $-\frac{1}{2}V_{REF}$ voltage swing.

When the configuration shown in FIG. 10 is used, the calibration voltage is either $+\frac{1}{4}V_{REF}$ or $-\frac{1}{4}V_{REF}$. Additional circuitry is therefore needed to generate either $+\frac{1}{4}V_{REF}$ or $-\frac{1}{4}V_{REF}$ from the reference voltages $+V_{REF}$ and $-V_{REF}$. The additional circuitry to generate fractions of the reference voltage $+V_{REF}$ and $-V_{REF}$ may require DC current and can lead to increased power dissipation. Since reference voltages $+V_{REF}$ and $-V_{REF}$ are readily available to the switched capacitor circuit but fractions of voltages $+V_{REF}$ and $-V_{REF}$ need to be separately generated, it is sometimes more desirable to perform the calibration using the inherently available reference voltages $+V_{REF}$ and $-V_{REF}$ only.

Figure 11:
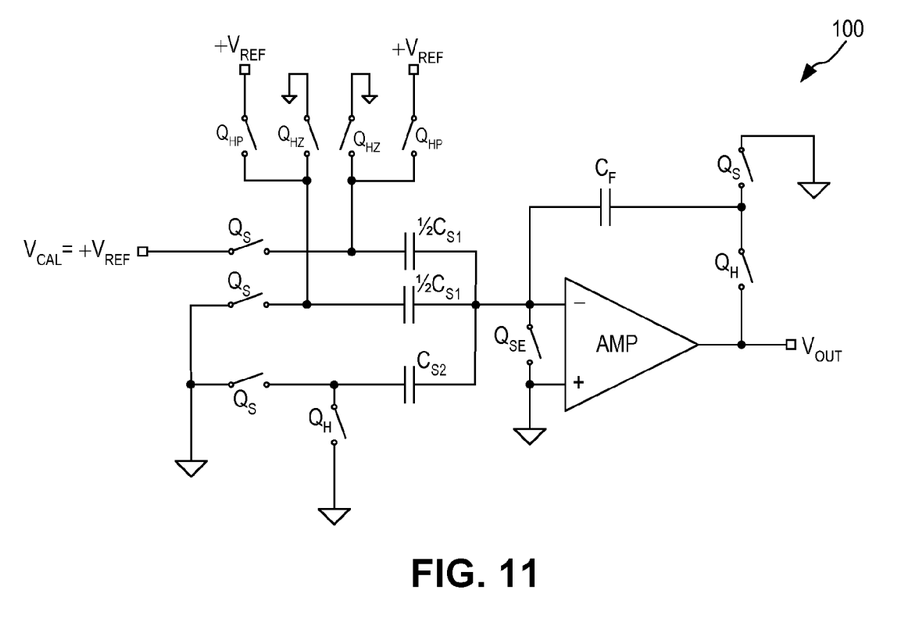
FIG. 11 is a circuit diagram of a switched capacitor circuit configured for use as a MDAC stage of a pipeline ADC according to a second embodiment of the present invention.

FIG. 11 is a circuit diagram of a switched capacitor circuit configured for use as a MDAC stage of a pipeline ADC according to a second embodiment of the present invention. FIG. 11 illustrates the switched capacitor circuit 100 configured specifically for calibration of capacitor mismatch error. Additional sample and hold switches and reference voltage connections needed for normal operation are not shown in FIG. 11 for simplicity but it is understood that additional sample and hold switches and reference voltage connections are needed to operate switched capacitor circuit 100 in the normal operation mode.

Referring to FIG. 11, switched capacitor circuit 100 performs calibration using only reference voltage $V_{REF}$ and does not require fractions of the reference voltage $V_{REF}$ to be generated. More specifically, sampling capacitor $C_{S1}$ is split into two halves and each half is sampled with a different calibration voltage. During the sampling phase, one half of capacitor $C_{S1}$ is sampled with the reference voltage $V_{REF}$ and the other half of capacitor $C_{S1}$ is sampled with 0V. Capacitor $C_{S2}$ is also sampled with 0V. During the holding or amplification period ($Q_H$ active), level shift voltages $+V_{REF}$ and 0V are alternately connected to the left side of both halves of capacitors $C_{S1}$ to measure capacitor mismatch between capacitors $\frac{1}{2}C_{S1}$ and capacitor $C_F$ while capacitor $C_{S2}$ is connected to 0V. The level shifting operation therefore causes the output voltage to switch from $+\frac{1}{2}V_{REF}$ to $-\frac{1}{2}V_{REF}$. The actual output voltage $V_{OUT}$ at the two offset voltage levels (0V and $+V_{REF}$) is compared with the ideal output voltage at the two offset voltage levels to determine the amount of mismatch error.

Splitting the sampling capacitor $C_{S1}$ into two half size capacitors enables the output voltage $V_{OUT}$ to have the same voltage values as in normal operation without generating additional reference voltages such as $\frac{1}{4}V_{REF}$. However, splitting sampling capacitor $C_{S1}$ into two half size capacitors increases the circuit complexity and parasitic around the two half sized $C_{S1}$ capacitors and capacitor $C_{S2}$. According to another aspect of the present invention, a switched capacitor circuit is implemented by splitting the feedback capacitor $C_F$ into two halves and sampling the reference voltage $V_{REF}$ on only one half of capacitor $C_F$. In this manner, the output voltage $V_{OUT}$ have voltage values as in normal operations without the need for generating fractions of the reference voltage and also without introducing complex circuitry and undesirable parasitic.

In an alternate embodiment to FIG. 11, a calibration voltage of $-V_{REF}$ can be used and the level shift voltages will be alternating between 0V and $-V_{REF}$. The output voltage will switch between $-\frac{1}{2}V_{REF}$ to $+\frac{1}{2}V_{REF}$.

Figure 12:
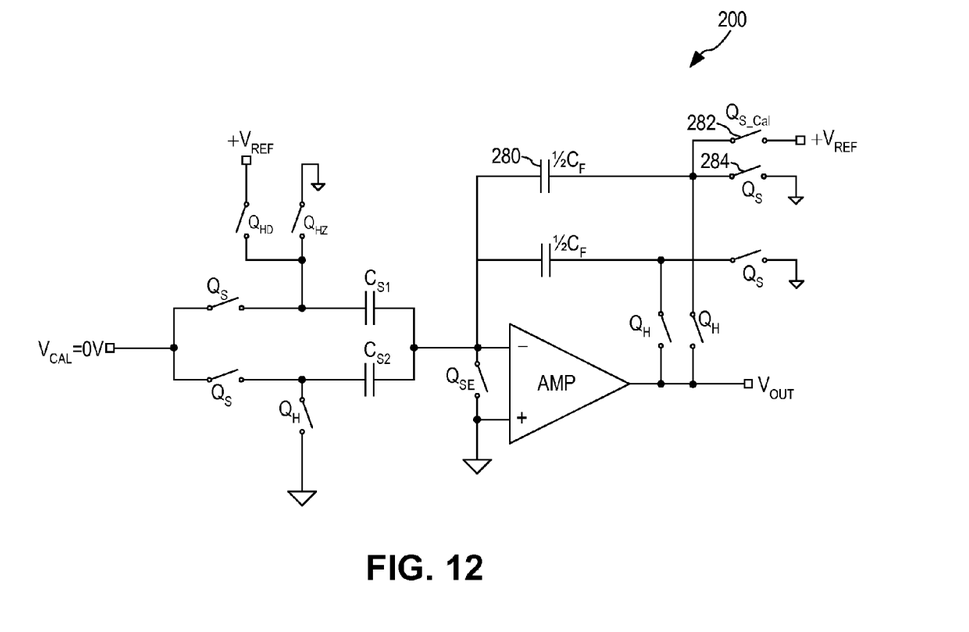
FIG. 12 is a circuit diagram of a switched capacitor circuit configured for use as a MDAC stage of a pipeline ADC according to a third embodiment of the present invention.

FIG. 12 is a circuit diagram of a switched capacitor circuit configured for use as a MDAC stage of a pipeline ADC according to a third embodiment of the present invention. FIG. 12 illustrates the switched capacitor circuit 200 configured specifically for calibration of capacitor mismatch error. Additional sample and hold switches and reference voltage connections needed for normal operation are not shown in FIG. 12 for simplicity but it is understood that additional sample and hold switches and reference voltage connections are needed to operate switched capacitor circuit 200 in the normal operation mode.

Referring to FIG. 12, switched capacitor circuit 200 performs calibration using only reference voltage $V_{REF}$ and does not require fractions of the reference voltage $V_{REF}$ to be generated. More specifically, feedback capacitor $C_F$ is split into two halves with each half being charged to a different voltage during the sampling phase. During the sampling phase, a calibration voltage $V_{CAL}$ of 0V is sampled onto the two sampling capacitors $C_{S1}$ and $C_{S2}$. Also, one of the half feedback capacitor, $\frac{1}{2}C_F$, is charged to the reference voltage $V_{REF}$ during the sampling phase while the other half feedback capacitor, $\frac{1}{2}C_F$, is charged to 0V. Capacitor 280, being $\frac{1}{2}C_F$, is charged to the reference voltage $V_{REF}$ through a switch 282 controlled by a clock signal $Q_{S\_Cal}$. Switch 282 is open during normal operation and is used only during calibration of the switched capacitor circuit. Switch 284, controlled by clock signal $Q_S$, is active during normal operation to charge capacitor 280 to 0V during the sampling phase.

During the holding or amplification period ($Q_H$ active), level shift voltages 0V and $+V_{REF}$ are alternately connected to the left side of capacitor $C_{S1}$ to measure capacitor mismatch between capacitor $C_{S1}$ and capacitor $C_F$ while capacitor $C_{S2}$ is connected to 0V. When level shift voltage 0V is connected to the left side of capacitor $C_{S1}$ during the hold phase (when $Q_H$ is active), the output voltage $V_{OUT}$ is $+\frac{1}{2}V_{REF}$, due to voltage $V_{REF}$ being sampled onto one-half of the feedback capacitor $C_F$ (i.e. $\frac{1}{2}C_F$). When level shift voltage $+V_{REF}$ is connected to the left side of capacitor $C_{S1}$, the positive reference voltages pushes down the output voltage $V_{OUT}$ to $-\frac{1}{2}V_{REF}$. The level shifting operation therefore causes the output voltage to switch from $+\frac{1}{2}V_{REF}$ to $-\frac{1}{2}V_{REF}$. The actual output voltage $V_{OUT}$ at the two offset voltage levels (0V and $+V_{REF}$) is compared with the ideal output voltage at the two offset voltage levels to determine the amount of mismatch error.

In an alternate embodiment, capacitor $\frac{1}{2}C_F$ (280) can be sampled with reference voltage $-V_{REF}$ instead of $+V_{REF}$ during the sampling phase. The level shift voltages of 0V and $-V_{REF}$ will be used during the holding phase. In that case, the output voltage $V_{OUT}$ will switch from $-\frac{1}{2}V_{REF}$ to $+V_{REF}$ and the amount of capacitor mismatch can be measured by comparing the actual output voltage to the ideal output voltage.

In the embodiment shown in FIG. 12, a 1.5 bit MDAC stage is shown. One of ordinary skill in the art would appreciate that the calibration technique can be extended to an n.5-bit MDAC stages by including $2^n$ sampling capacitors. The mismatch between each sampling capacitor $C_{S1}$ versus feedback capacitor $C_F$ can be measured by performing the same measurement technique for each $C_{S1}$ as described above.

Figure 13:
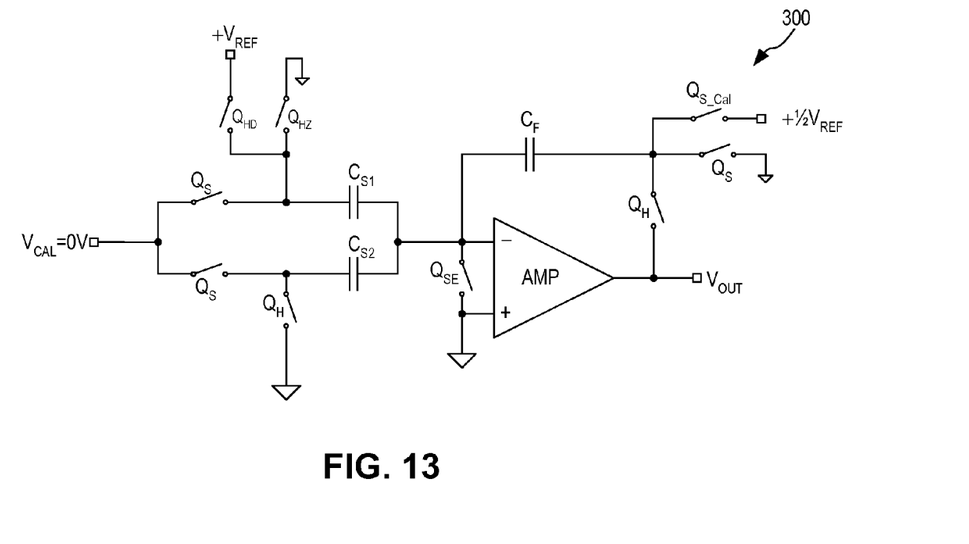
FIG. 13 is a circuit diagram of a switched capacitor circuit configured for use as a MDAC stage of a pipeline ADC according to a fourth embodiment of the present invention.

FIG. 13 is a circuit diagram of a switched capacitor circuit configured for use as a MDAC stage of a pipeline ADC according to a fourth embodiment of the present invention. FIG. 13 illustrates the switched capacitor circuit 300 configured specifically for calibration of capacitor mismatch error. Additional sample and hold switches and reference voltage connections needed for normal operation are not shown in FIG. 13 for simplicity but it is understood that additional sample and hold switches and reference voltage connections are needed to operate switched capacitor circuit 300 in the normal operation mode.

Referring to FIG. 13, switched capacitor circuit 300 implements the same calibration method as switched capacitor circuit 200 of FIG. 12 but with a single feedback capacitor $C_F$. Switched capacitor circuit 300 illustrates that the calibration technique of FIG. 12 can be implemented in the same manner with a single feedback capacitor $C_F$ but charging the feedback capacitor $C_F$ to a voltage of $+\frac{1}{2}V_{REF}$ only. The implementation of switched capacitor circuit 300 requires generating a fractional reference voltage of $-\frac{1}{2}V_{REF}$. Each of the embodiments shown in FIGS. 11 and 12 has its own advantages of either using the reference voltage only or having a single feedback capacitor $C_F$ versus split feedback capacitors. Both embodiments operate in the same way to allow calibration of the capacitor mismatch error while the output voltage $V_{OUT}$ behaves as in normal circuit operation (between $-\frac{1}{2}V_{REF}$ and $+\frac{1}{2}V_{REF}$).

The capacitor mismatch calibration method applied to switched capacitor 200 in FIG. 12 has the particular advantages of minimizing additional circuitry required for its implementation and the additional circuitry are added to the feedback capacitor rather than the sampling capacitor. The capacitor mismatch calibration method in FIG. 12 avoids adding circuitry to the critical analog signal path around the sampling capacitors. Furthermore, the capacitor mismatch calibration method in FIG. 12 avoids generating an additional voltage value and can be implemented using the inherent reference voltage $V_{REF}$ only.

In summary, the foreground calibration method for measuring capacitor mismatch error described in the above embodiments has the advantages of enabling the use of minimally sized sampling capacitor, which meets the target noise floor of an ADC but not for the capacitor matching requirement. Furthermore, the capacitor mismatch calibration method minimizes parasitic resistance and/or capacitance for higher operating speed by appropriately allocating sampling and feedback capacitors in the circuit layout. Since capacitor matching is not a concern for the design, even low cost fringing capacitor with minimal spaced stacked metal lines, which is known as COMB capacitor, can be used instead of higher cost and/or larger parasitic capacitance poly-poly and/or metal-insulator-metal (MIM) capacitor module.

In the above descriptions, the switched capacitor circuit is applied in a pipeline ADC. The application of the switched capacitor circuit to a pipeline ADC is illustrative only. One of ordinary skill in the art would appreciate that the calibration method described herein can be applied to switched capacitor circuit being applied in any applications.

The above detailed descriptions are provided to illustrate specific embodiments of the present invention and are not intended to be limiting. Numerous modifications and variations within the scope of the present invention are possible. The present invention is defined by the appended claims.

I claim:

1. A method for calibrating a capacitor mismatch error between a sampling capacitor and a feedback capacitor in a switched capacitor circuit, the method comprising:
    providing the sampling capacitor having a first plate coupled to sample an analog input voltage and a second plate coupled to a first input terminal of an amplifier;
    providing the feedback capacitor having a first plate coupled to the first input terminal of the amplifier, and a second plate switchably connected to an output terminal of an amplifier and further switchably connected to a ground voltage;
    sampling a fixed input voltage onto the sampling capacitor during a sampling phase of the switched capacitor circuit;
    placing the switched capacitor circuit in a hold/amplification phase of the switched capacitor circuit;
    providing a pair of level shift voltages alternately to the first plate of the sampling capacitor;
    generating a pair of output voltages at the output terminal of the amplifier, the pair of output voltages being a function of the sampled fixed input voltage, amplified by the amplifier and level shifted by the pair of level shift voltages, the pair of output voltages resembling output voltages in normal operation of the switched capacitor circuit; and
    comparing the pair of output voltages with respective corresponding ideal output voltages values to determine the capacitor mismatch error.

2. The method of claim 1, wherein sampling a fixed input voltage onto the sampling capacitor during a sampling phase of the switched capacitor circuit comprises sampling a voltage of 0V, or a positive or negative DC voltage equal to or being a fraction of the reference voltage of the switched capacitor circuit, the reference voltage defining the input voltage range and the output voltage range of the switched capacitor circuit.

3. The method of claim 2, wherein generating a pair of output voltages at the output terminal of the amplifier comprises generating a pair of output voltages having values within a positive reference voltage and a negative reference voltage.

4. The method of claim 2, wherein generating a pair of output voltages at the output terminal of the amplifier comprises generating a pair of output voltages having values within one-half of a positive reference voltage and one-half of a negative reference voltage.

5. The method of claim 2, wherein providing the sampling capacitor comprises providing a first sampling capacitor and a second sampling capacitor connected in parallel through respective sampling switches, and wherein placing the switched capacitor circuit in a hold/amplification phase and providing a pair of level shift voltages alternately to the first plate of the sampling capacitor comprise:
    coupling a first plate of the first sampling capacitor to the pair of level shift voltages alternately during the hold/amplification phase, the second plate of the first sampling capacitor being connected to the first input terminal of the amplifier; and
    coupling a first plate of the second sampling capacitor to a ground voltage during the hold/amplification phase, the second plate of the second sampling capacitor being connected to the first input terminal of the amplifier.

6. The method of claim 5, wherein providing a first sampling capacitor and a second sampling capacitor further comprises providing a third sampling capacitor and a fourth sampling capacitor as the first sampling capacitor, the third sampling capacitor being connected to the first input terminal of the amplifier and being coupled to sample the fixed input voltage, the fourth sampling capacitor being connected to the first input terminal of the amplifier and being coupled to sample the ground voltage.

7. The method of claim 6, wherein the fixed input voltage comprises a positive first reference voltage and the pair of level shift voltages comprises 0V and a negative first reference voltage.

8. The method of claim 5, wherein the fixed input voltage comprises one-fourth of the reference voltage and the pair of level shift voltages comprise 0V and the reference voltage of the negative polarity.

9. The method of claim 5, wherein the fixed input voltage comprises 0V and the pair of level shift voltages comprises 0V and the reference voltage of the positive or negative polarity.

10. The method of claim 5, wherein the fixed input voltage comprises 0V and the pair of level shift voltages comprises 0V and the reference voltage of the positive and negative polarities.

11. The method of claim 1, wherein the feedback capacitor comprises a first feedback capacitor and a second feedback capacitor connected in parallel through respective sampling switches, and wherein sampling a fixed input voltage onto the sampling capacitor during a sampling phase of the switched capacitor circuit comprises:

sampling a first fixed input voltage onto the sampling capacitor and sampling a second fixed input voltage onto the first feedback capacitor during a sampling phase of the switched capacitor circuit.

12. The method of claim 11, wherein providing a pair of level shift voltages alternately to a first plate of the sampling capacitor comprises providing 0V and the second fixed input voltage as the pair of level shift voltages.

13. The method of claim 1, wherein sampling a fixed input voltage onto the sampling capacitor during a sampling phase of the switched capacitor circuit comprises:

sampling a first fixed input voltage onto the sampling capacitor and sampling a second fixed input voltage onto the first feedback capacitor during a sampling phase of the switched capacitor circuit.

14. The method of claim 13, wherein providing a pair of level shift voltages alternately to a first plate of the sampling capacitor comprises providing 0V and the two times the second fixed input voltage as the pair of level shift voltages.

* * * * *